United States Patent
Kitanaka

(10) Patent No.: US 9,240,750 B2
(45) Date of Patent: Jan. 19, 2016

(54) FORCED AIR COOLING-TYPE POWER CONVERSION DEVICE

(75) Inventor: Hidetoshi Kitanaka, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 80 days.

(21) Appl. No.: 14/359,629

(22) PCT Filed: Nov. 30, 2011

(86) PCT No.: PCT/JP2011/077720
§ 371 (c)(1),
(2), (4) Date: May 21, 2014

(87) PCT Pub. No.: WO2013/080345
PCT Pub. Date: Jun. 6, 2013

(65) Prior Publication Data
US 2014/0301041 A1    Oct. 9, 2014

(51) Int. Cl.
*H05K 7/20*    (2006.01)
*H02P 29/00*    (2006.01)
*H02M 7/00*    (2006.01)

(52) U.S. Cl.
CPC .......... *H02P 29/0088* (2013.01); *H02M 7/003* (2013.01); *H05K 7/20909* (2013.01); *H05K 7/20918* (2013.01)

(58) Field of Classification Search
CPC .......... H05K 7/20154; H05K 7/20909; H05K 13/0023; H02M 7/162; H02M 7/797; H02P 29/0088
See application file for complete search history.

(56) References Cited

U.S. PATENT DOCUMENTS

| 5,804,761 | A  | * | 9/1998 | Donegan | ................. | H02G 5/10 |
| | | | | | | 174/15.1 |
| 7,068,507 | B2 | * | 6/2006 | Pfeifer | ............... | H05K 7/20927 |
| | | | | | | 165/104.33 |

(Continued)

FOREIGN PATENT DOCUMENTS

DE    10 2006 060 046 A1    12/2007
EP    2 157 685 A1    2/2010

(Continued)

OTHER PUBLICATIONS

The extended European Search Report issued on Jun. 24, 2015, by the European Patent Office in corresponding European Application No. 11876629.4. (6 pages).

(Continued)

*Primary Examiner* — Gregory Thompson
(74) *Attorney, Agent, or Firm* — Buchanan Ingersoll & Rooney PC

(57) ABSTRACT

Power conversion sub-blocks are combined to be configured as a power conversion block. The power conversion sub-blocks include power conversion modules including cooler base sections on which semiconductor elements are mounted and cooler fin sections provided on the rear surface side of semiconductor element mounting surfaces in the cooler base sections and cooler attachment members to which cooler fin sections are attached back to back, the cooler attachment members being configured to be capable of separating an opened section where the cooler fin sections are present and external air circulates and a closed section where the semiconductor elements are present and circulating cooling air to the cooler fin sections.

6 Claims, 12 Drawing Sheets

(56) References Cited

U.S. PATENT DOCUMENTS

| | | | | |
|---|---|---|---|---|
| 7,515,422 | B2 * | 4/2009 | Hirota | H02M 1/36 174/252 |
| 7,760,503 | B2 * | 7/2010 | Aoki | H01L 23/473 165/104.33 |
| 8,169,780 | B2 * | 5/2012 | Yoshino | H05K 7/20927 165/104.33 |
| 8,890,455 | B2 * | 11/2014 | Toda | B60L 3/003 318/34 |
| 2002/0089056 | A1 * | 7/2002 | Eady | H05K 7/1424 257/712 |
| 2007/0279864 | A1 | 12/2007 | Hirota et al. | |
| 2009/0260905 | A1 * | 10/2009 | Shinmura | B60K 1/04 180/68.1 |
| 2010/0277871 | A1 * | 11/2010 | Kitanaka | B60L 9/16 361/710 |
| 2011/0194253 | A1 * | 8/2011 | Momose | H01L 23/467 361/697 |
| 2011/0199736 | A1 | 8/2011 | Sawada et al. | |
| 2012/0044640 | A1 | 2/2012 | Harada et al. | |

FOREIGN PATENT DOCUMENTS

| | | |
|---|---|---|
| GB | 2 178 243 A | 2/1987 |
| JP | 3-011924 A | 1/1991 |
| JP | 2006-025556 A | 1/2006 |
| WO | WO 2011/004450 A1 | 1/2011 |

OTHER PUBLICATIONS

International Search Report (PCT/ISA/210) mailed on Mar. 13, 2012, by the Japanese Patent Office as the International Searching Authority for International Application No. PCT/JP2011/077720.

Written Opinion (PCT/ISA/237) mailed on Mar. 13, 2012, by the Japanese Patent Office as the International Searching Authority for International Application No. PCT/JP2011/077720.

Japanese Office Action mailed on Apr. 30, 2014, 2 pages.

* cited by examiner

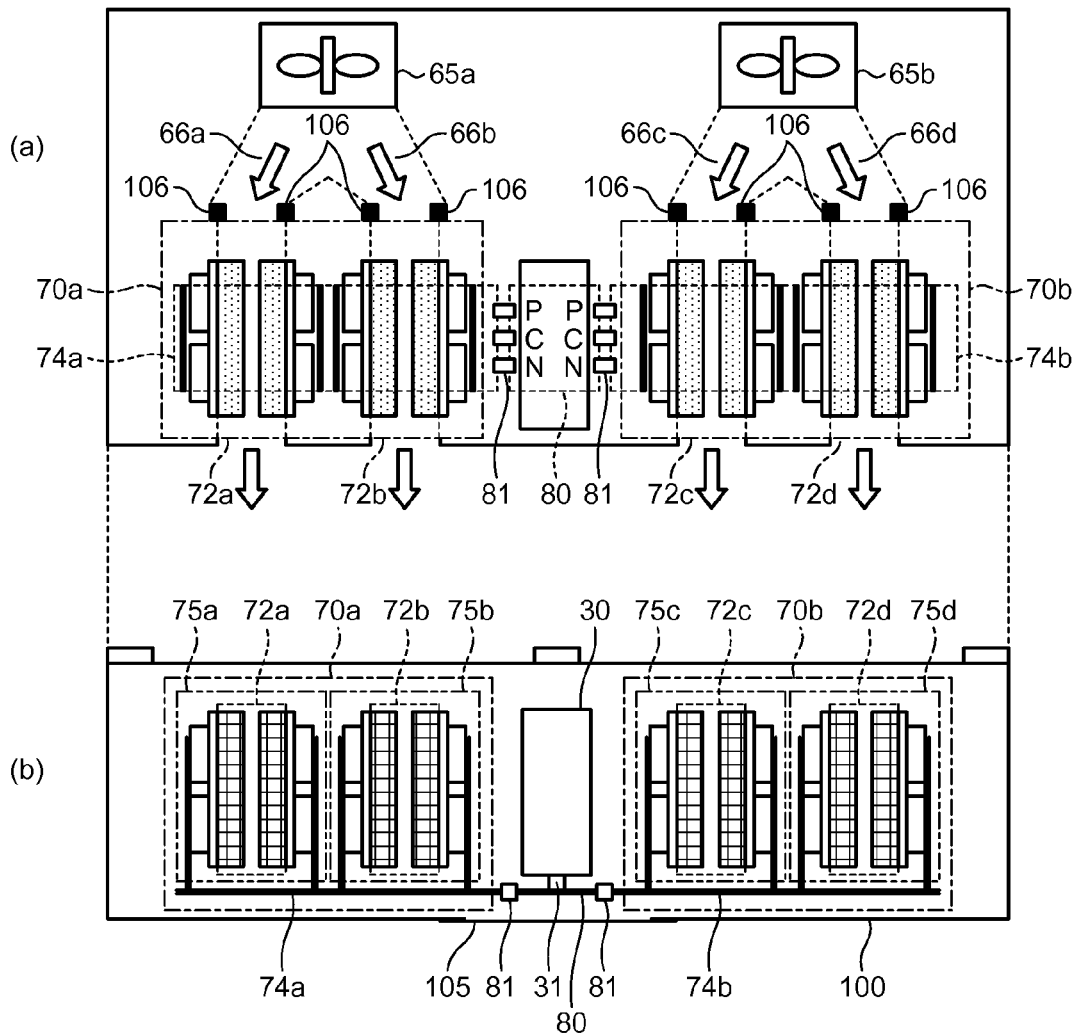
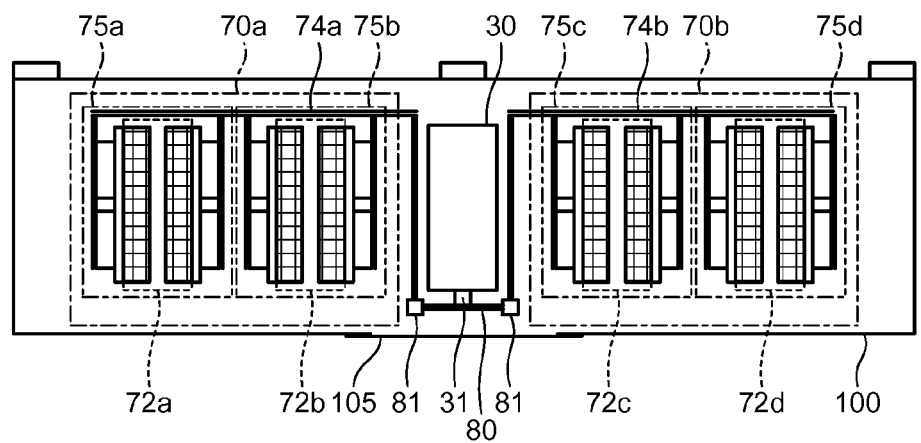

FIG.13
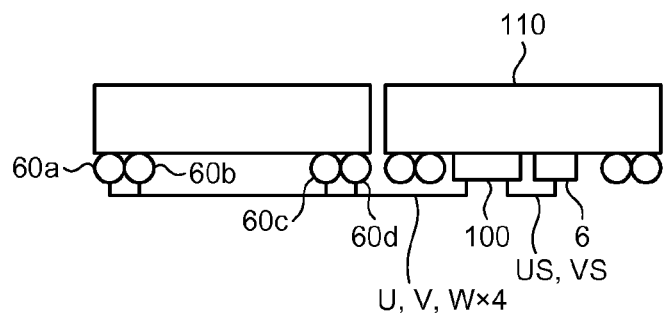
(a) DEVICE ARRANGEMENT EXAMPLE
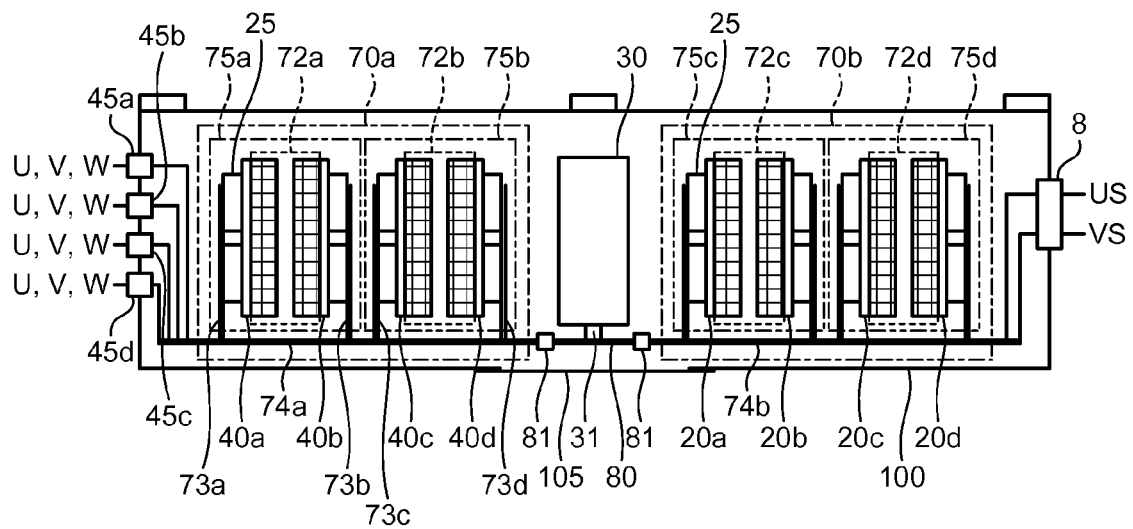
(b) POWER CONVERSION MODULE ARRANGEMENT EXAMPLE

FIG.14
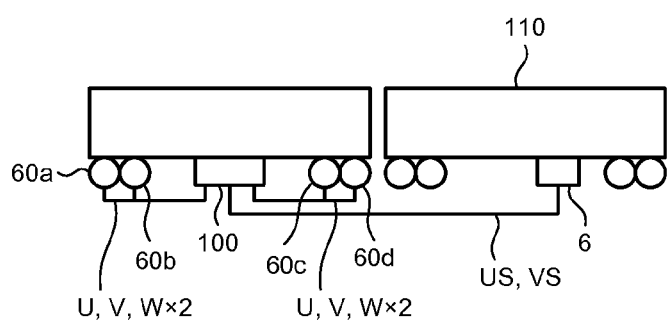
(a) DEVICE ARRANGEMENT EXAMPLE
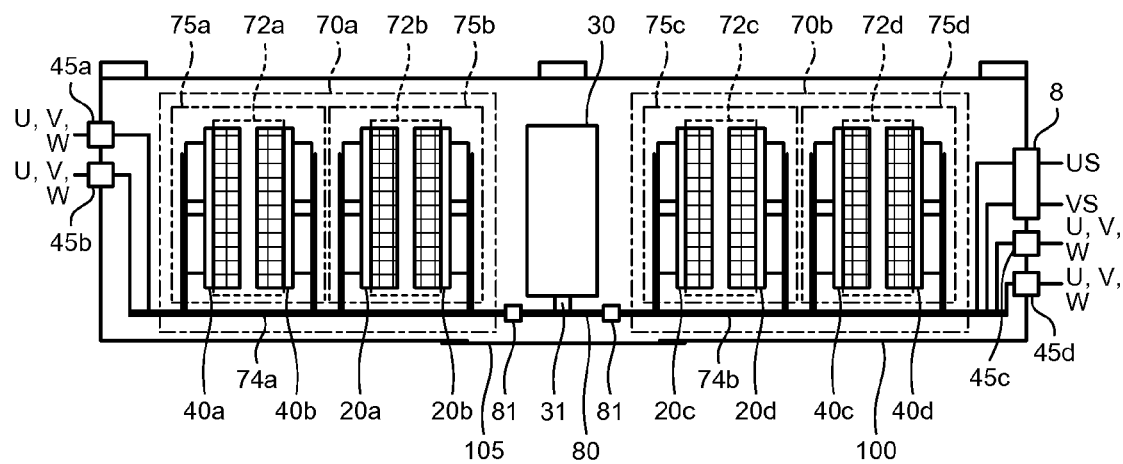
(b) POWER CONVERSION MODULE ARRANGEMENT EXAMPLE

FORCED AIR COOLING-TYPE POWER CONVERSION DEVICE

FIELD

The present invention relates to a forced air cooling-type power conversion device suitable for alternating-current motor control for electric motor vehicle driving.

BACKGROUND

In general, a power conversion device for an electric motor vehicle according to the related art is configured to collectively drive, in parallel, with one inverter circuit in the power conversion device, a plurality of induction motors directly connected to axles mounted on trucks of the electric motor vehicle.

Usually, in many examples, the power conversion device of this type is configured to collectively control, in parallel, with one inverter circuit, four induction motors that respectively drive four axles in total incorporated in trucks arranged at both ends of the electric motor vehicle.

Further, in a power conversion device for driving an electric motor vehicle that travels in an alternating-current section, a converter circuit for once converting alternating-current power received from an overhead wire into a direct current and supplying the direct current to an inverter circuit is added.

As a cooling system in the power conversion device for electric motor vehicle driving, for a reduction in the size and the weight of the device, a forced air cooling system for circulating the external air with a cooling fan to cool an inverter circuit and a converter circuit (both the circuits are hereinafter generally referred to as "power conversion circuit") is the main stream (e.g., Patent Literature 1).

CITATION LIST

Patent Literature

Patent Literature 1: Japanese Patent Application Laid-Open No. 2006-025556

SUMMARY

Technical Problem

In recent years, in alternating-current motor application fields such as industrial machine and consumer electronics fields and an automobile field, a permanent magnet synchronous motor is applied instead of the conventional induction motor in more cases. In the permanent magnet synchronous motor, an excitation current is unnecessary because a magnetic flux by a permanent magnet is established. A secondary copper loss does not occur because an electric current does not flow to a rotor. Therefore, the permanent magnet synchronous motor is known as a high-efficiency motor compared with the induction motor. In recent years, application of the permanent magnet synchronous motor to a power conversion device for electric motor vehicle driving is also examined.

A problem in applying the permanent magnet synchronous motor to the driving use for an electric motor vehicle is how to configure a power conversion device that drives a plurality of the permanent magnet synchronous motors. That is, as it is already known, the permanent magnet synchronous motor operates with an inverter frequency and a rotor frequency synchronized with each other. Therefore, unlike the induction motor of the related art, the permanent magnet synchronous motors cannot be collectively driven in parallel by one inverter. This is because, in the application example to the electric motor vehicle, the rotation speeds and the phases of wheels during operation are different depending on the difference in a wheel diameter, idling, and the like and, therefore, the rotation speeds and the phases of the motors do not coincide with one another.

Therefore, it is necessary to provide an individual inverter circuit for driving corresponding to each of the permanent magnet synchronous motors. In the case of the electric motor vehicle, a configuration of a power distribution system for driving wheels of the electric motor vehicle with a plurality of motors in a formation is the main stream. Therefore, compared with a system adopting a plurality of the conventional induction motors that can be collectively driven in parallel, the number of necessary inverter circuits increases. As a result, there is a problem in that the size, the weight, and the costs of the inverter circuit increase.

Note that, in the system adopting the induction motor, there is also a system that independently and individually controls a plurality of induction motors connected to wheels. However, in this case, like the system for driving the permanent magnet synchronous motor, it is necessary to individually provide independent inverter circuits corresponding to the motors. Therefore, the number of necessary inverter circuits increases. Like the permanent magnet synchronous motor, there is a problem in that the size, the weight, and the costs of the inverter circuit increase.

In the case of the power conversion device for the electric motor vehicle that travels in the alternating-current section, the number of the converter circuits (or the number of parallel semiconductor elements configuring the converter circuit) increases depending on a device capacity. As a result, there is also a problem in that the size, the weight, and the costs of the converter circuit increase.

Note that the power conversion device for the electric motor vehicle is often arranged under the floor of the electric motor vehicle, and thus it goes without saying that the power conversion device is desired to have a structure that can be reduced in size and weight.

The present invention has been devised in view of the above and it is an object of the present invention to provide a forced air cooling-type power conversion device configured to be capable of controlling an increase in the size, the weight, and the costs of a power conversion circuit even when a forced air cooling-type power conversion device of a system for individually driving a plurality of motors is configured.

Solution to Problem

In order to solve the aforementioned problems, a forced air cooling-type power conversion device equipped with power conversion circuits including a plurality of semiconductor elements according to one aspect of the present invention is constructed in such a manner that it converts electric power input from a power supply into an arbitrary value and outputting the electric power to a motor, wherein power conversion sub-blocks are combined to be configured as power conversion blocks, the power conversion sub-blocks each including: a power conversion module including: a part of the semiconductor elements configuring the power conversion circuit; a cooler base section on which the semiconductor elements are mounted; and a cooler fin section provided on a rear surface side of the semiconductor element mounting surface in the cooler base section; and a cooler attachment member to which the cooler fin sections in at least a pair of the power conversion modules are attached back to back, the cooler attachment member being configured to be capable of separating an opened section where the cooler fin sections are present and external air circulates and a closed section where the semiconductor elements are present and circulating cooling air to the cooler fin section.

Advantageous Effects of Invention

With the electric motor vehicle control device according to the present invention, there is an effect that it is possible to suppress an increase in the size, the weight, and the costs of the power conversion circuit even when a forced air cooling-type power conversion device of a system for individually driving a plurality of motors is configured.

BRIEF DESCRIPTION OF DRAWINGS

FIG. 6 is a top view and a side view of an internal arrangement configuration example of the power conversion device in the embodiment of the present invention.

FIG. 7 is a side view of another example of the internal arrangement configuration of the power conversion device in the embodiment of the present invention.

FIG. 13 is a diagram of an example of device arrangement and power conversion module arrangement in the embodiment of the present invention.

FIG. 14 is a diagram of another example of the device arrangement and the power conversion module arrangement in the embodiment of the present invention.

DESCRIPTION OF EMBODIMENTS

A forced air cooling-type power conversion device (hereinafter simply referred to as "power conversion device") according to an embodiment of the present invention is explained with reference to the accompanying drawings. Note that, in the embodiment explained below, a power conversion device of an alternating-current input type that drives a permanent magnet synchronous motor is explained as an example. However, the present invention is not limited by the embodiment.

Figure 1:
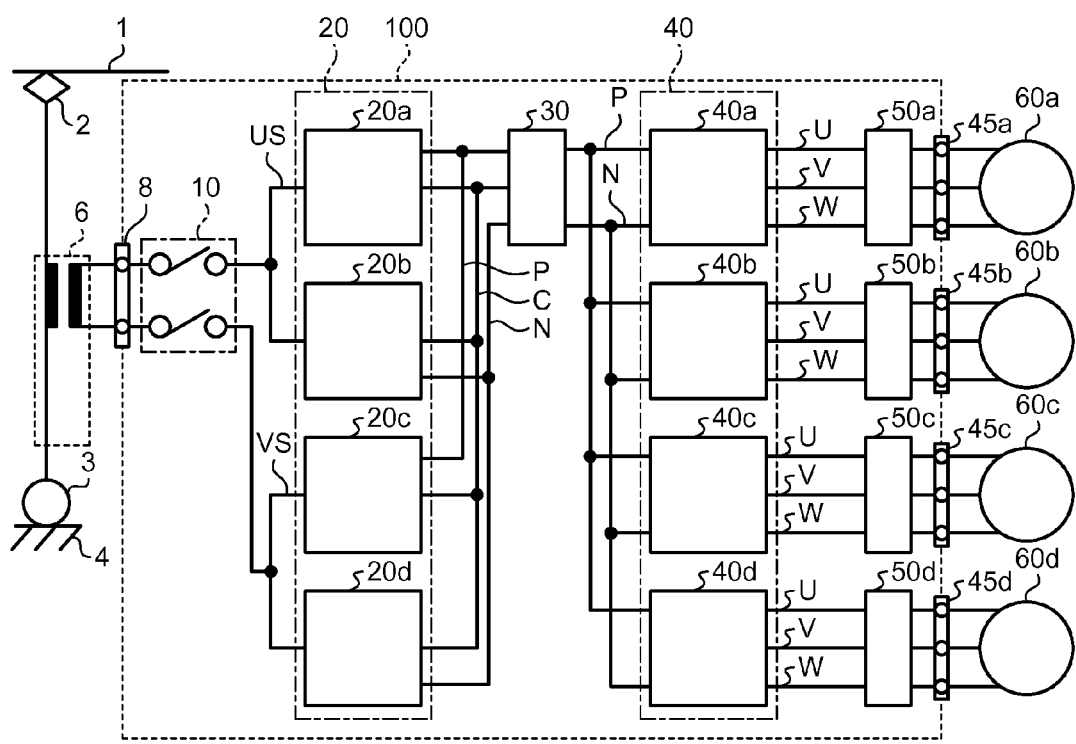
FIG. 1 is a diagram of a configuration example of a power conversion device in an embodiment of the present invention.
Figure 2:
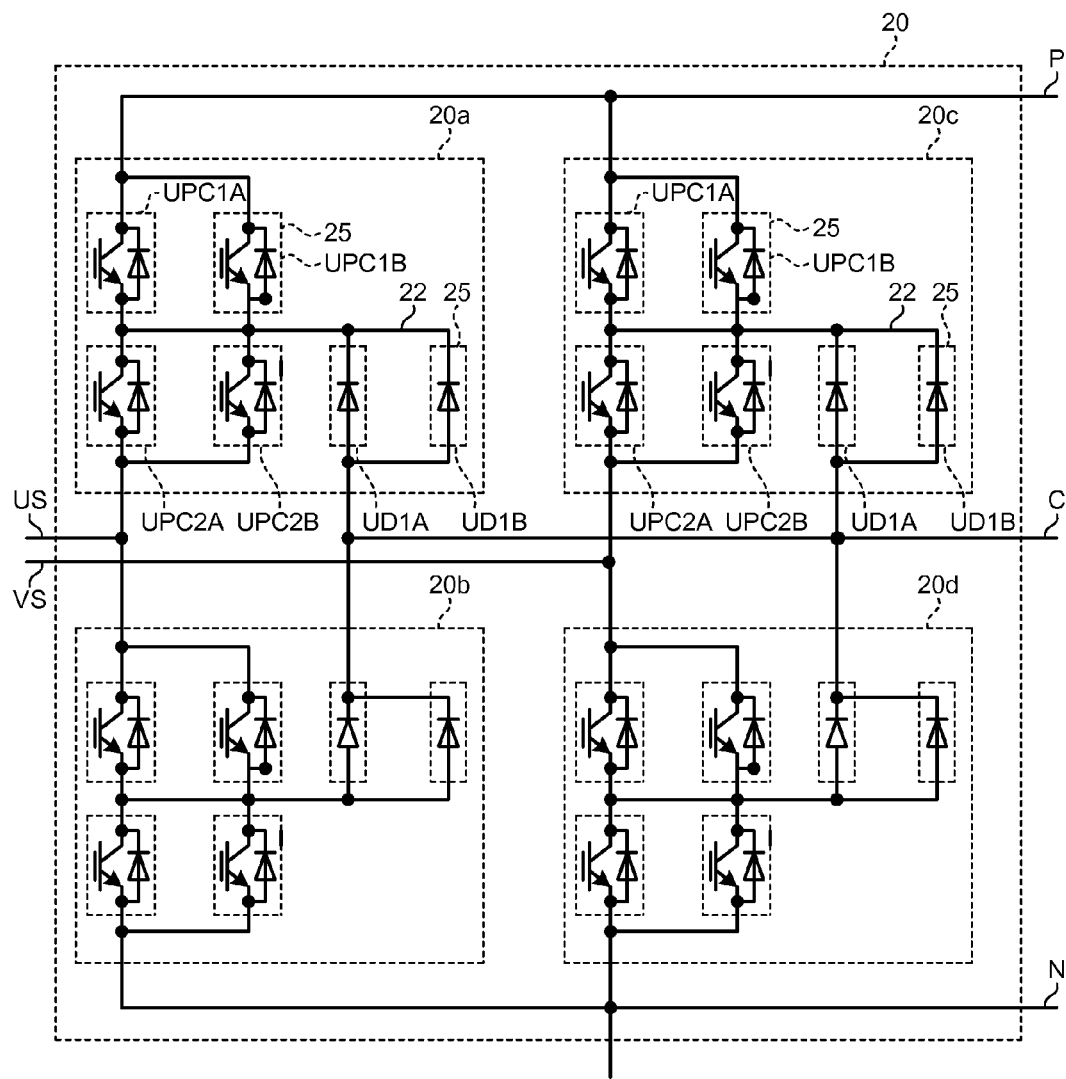
FIG. 2 is a diagram of a configuration example of a converter circuit in the embodiment of the present invention.
Figure 3:
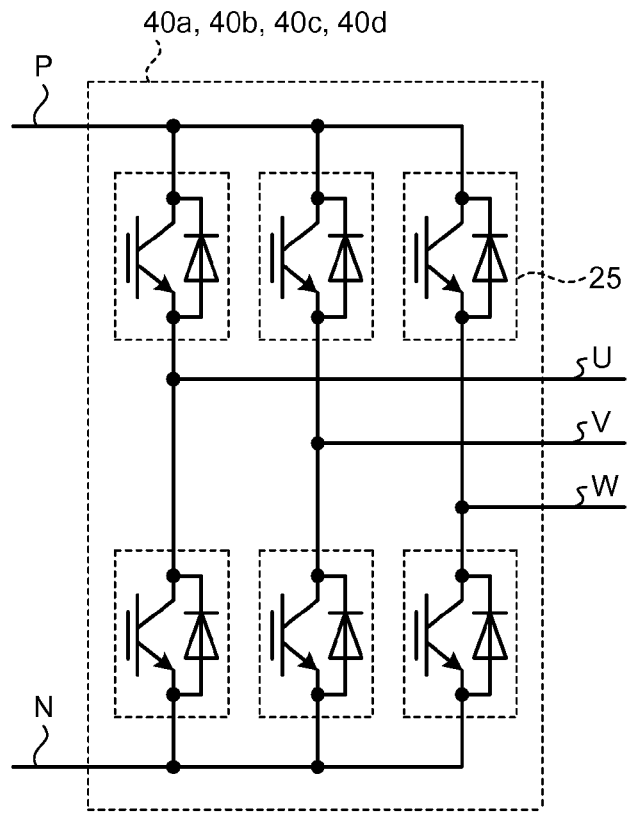
FIG. 3 is a diagram of a configuration example of an inverter circuit in the embodiment of the present invention.
Figure 4:
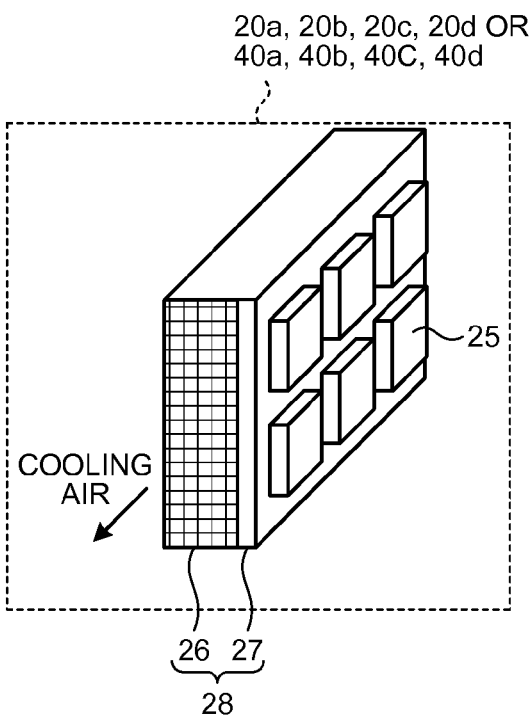
FIG. 4 is a diagram of a configuration example of a converter power conversion module or an inverter power conversion module in the embodiment of the present invention.
Figure 5:
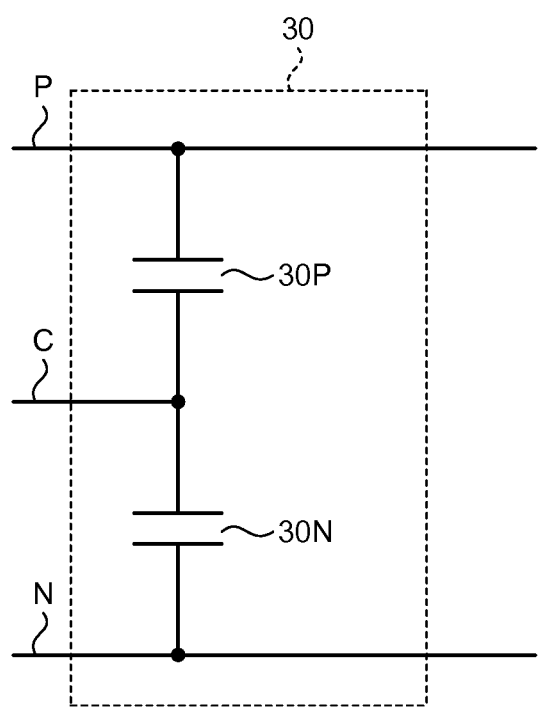
FIG. 5 is a diagram of a configuration example of a capacitor module in the embodiment of the present invention.

First, the overall configuration of the power conversion device in the embodiment of the present invention and the configuration of a converter circuit, an inverter circuit, a converter power conversion module, an inverter power conversion module, and a capacitor module configuring the power conversion device in this embodiment are explained with reference to the drawings of FIG. 1 to FIG. 5. FIG. 1 is a diagram of a configuration example of the power conversion device in the embodiment of the present invention. FIG. 2 is a diagram of a configuration example of a converter circuit 20 in the embodiment of the present invention. FIG. 3 is a diagram of a configuration example of an inverter circuit 40 in the embodiment of the present invention. FIG. 4 is a diagram of a configuration example of the converter power conversion module or the inverter power conversion module in the embodiment of the present invention. FIG. 5 is a diagram of a configuration example of a capacitor module 30 in the embodiment of the present invention.

As shown in FIG. 1, electric power transmitted from a transformer substation (not shown in the figures) functioning as a power supply is received through a current collector 2 set in contact with an overhead wire 1 and is input to a primary side of a transformer 6. Wires on the negative side from the transformer 6 are connected to a rail 4 through a wheel 3 and return to the not-shown transformer substation.

A secondary side of the transformer 6 is connected to a power conversion device 100 and input to an input switch 10 having a function of separating the power conversion device 100 from the transformer 6 side. The input switch 10 is a switch controlled to OFF when the power conversion device 100 is stopped or when an abnormality occurs and controlled to ON during a normal operation. The input switch 10 has an ability of capable of switching an electric current of several hundred amperes to several thousand amperes.

At the next stage of the input switch 10, a converter circuit 20 is provided that converts an alternating-current voltage, which is input via alternating-current input conductors US and VS, into an arbitrary direct-current voltage and outputs the arbitrary direct-current voltage to the capacitor module 30 with direct-current connection conductors P, C, and N. Note that the alternating-current input conductors US and VS have a current capacity of several hundred amperes and are mainly formed of, for example, copper.

The converter circuit 20 shown in FIG. 1 is configured, for example, as shown in FIG. 2. FIG. 2 shows a configuration example in which a voltage-type single-phase three-level converter often applied in electric motor vehicles in these days is applied. A bridge circuit is configured by semiconductor elements 25, which are IGBTs and diodes. The semiconductor elements are caused to perform a PWM operation. Because the configuration and the operation of the semiconductor elements 25 are publicly-known, explanation of the configuration and the operation is omitted. Note that, in FIG. 2, the semiconductor elements are shown in a form in which the semiconductor elements are connected in parallel, for example, UPC1A and UPC1B are connected in parallel, UPC2A and UPC2B are connected in parallel, and UD1A and UD1B are connected in parallel to secure the current capacity. However, the form in which the semiconductor elements are not connected in parallel can be adopted.

As shown in FIG. 2, the converter circuit 20 is configured by converter power conversion modules 20a to 20d. More specifically, the converter power conversion module 20a forms a U-phase upper arm, the converter power conversion module 20b forms a U-phase lower arm, the converter power conversion module 20c forms a V-phase upper arm, and the converter power conversion module 20d forms a V-phase lower arm. In this way, in FIG. 2, the converter circuit 20 is divided into the four converter power conversion modules 20a to 20d. The idea of the division is explained below.

The capacitor module 30 arranged in the output of the converter circuit 20 includes, as shown in FIG. 5, a capacitor 30P on the positive side and a capacitor 30N on the negative side. Direct-current connection conductors P, C, and N are provided in the capacitor module 30. The capacitor module 30 is configured as an aggregate in which, for example, a plurality of film capacitors are connected in parallel. The capacitor module 30 functions as an energy buffer that accumulates direct-current power. The capacitor module 30 has a function of absorbing a surge voltage and a high-frequency ripple current component generated by a switching operation of the semiconductor elements 25 included in the converter circuit 20 or the inverter circuit 40.

Note that the capacitor module 30 is connected to the converter power conversion modules 20a to 20d and inverter power conversion modules 40a to 40d by the direct-current connection conductors P, C, and N or the direct-current connection conductors P and N (see FIG. 1). If inductance components among the modules are large, the generation of the surge voltage and noise increases at timing when the semiconductor elements 25 perform the switching operation. Therefore, it is well-known for those skilled in the art that consideration should be taken to reduce the inductance components as much as possible. Accordingly, the direct-current connection conductors P, C, and N are configured to be as close as possible while securing insulation from one another. For example, it is preferable to use a laminate bus bar in which the conductors are made of copper thin plates and the conductors are insulated by insulation films. The conductors configured by the direct-current connection conductors P, C, and N are generally referred to as capacitor conductor plate 80. Note that more detailed contents concerning the capacitor conductor plate 80 are explained below.

The inverter circuit 40 is provided at the next stage of the capacitor module 30. The inverter circuit 40 is configured, for example, as shown in FIG. 3. In FIG. 3, a configuration example is shown in which a voltage-type three-phase two-level inverter is applied. A bridge circuit is configured by the semiconductor elements 25, which are IGBTs and diodes. The semiconductor elements are caused to perform a PWM operation. Because the configuration and the operation of the semiconductor elements 25 are publicly-known, explanation of the configuration and the operation is omitted. Note that, in FIG. 3, the semiconductor elements are not connected in parallel. However, for example, the semiconductor elements can be connected in parallel to secure a current capacity. It is also possible to apply a three-phase three-level inverter instead of the three-phase two-level inverter.

As shown in FIG. 3, the inverter circuit 40 is configured by the inverter power conversion modules 40a to 40d. Each of the inverter power conversion modules configures one inverter bridge circuit. For example, in FIG. 1, a configuration example is shown in which four alternating-current motors are respectively driven by four inverter power conversion modules.

Outputs sides of the inverter power conversion modules 40a to 40d are respectively connected to alternating-current motors 60a to 60d via motor opening switches 50a to 50d through alternating-current output conductors U, V, and W.

Main points in the configurations of the converter power conversion modules and the inverter power conversion modules are explained. Note that, in the following explanation, the converter power conversion modules and the inverter power conversion modules are generally referred to as power conversion modules.

As shown in FIG. 4, the converter power conversion modules 20a to 20d and the inverter power conversion modules 40a to 40d have similar configurations. The semiconductor elements 25 are arranged on a semiconductor element attachment surface (the right side in the figure) of a cooler 28 including a cooler base section 27 and a cooler fin section 26. That is, cooling air is caused to pass through the cooler fin section 26 to cool the semiconductor elements 25. Note that FIG. 4 shows a state in which six semiconductor elements 25 are mounted on the cooler 28. However, this configuration is an example. The number of the semiconductor elements 25 is not limited to six.

The cooler base section 27 is formed in a block shape using, for example, aluminum. The cooler base section 27 operates as a heat receiving section that receives generated heat of the semiconductor elements 25. The cooler fin section 26 is made of, for example, aluminum, configured as a fin of, for example, a comb shape or a lattice shape, and provided on the rear surface side of the mounting surface on which the semiconductor elements 25 are mounted. The cooler fin section 26 operates as a heat radiating section that radiates heat to the atmosphere. The semiconductor elements 25 and the cooler fin section 26 can be provided close to each other. Therefore, a coolant for heat transport is not used unlike a coolant boiling type. As a result, there is no limitation concerning a setting direction of the cooler 28, and the configuration of the cooler 28 is simplified. There is an advantage that the power conversion device can be configured with light weight and low costs.

Note that, as shown in FIG. 1 to FIG. 3, the number of the semiconductor elements 25 configuring the converter circuit 20 and the inverter circuit 40 incorporated in the power conversion device 100 is extremely large. Therefore, it is undesirable to mount all the semiconductor elements 25 on one cooler 28 because, for example, the cooler 28 increases in size and weight, it is difficult to house the cooler 28 in the power conversion device 100, attachment and detachment of the cooler 28 are hindered, and assembly work is made difficult.

Therefore, in this embodiment, the converter circuit 20 and the inverter circuit 40 are divided into a plurality of groups. The semiconductor elements 25 belonging to each of the groups are divided and mounted on a plurality of the coolers 28. Details of the division are as explained below.

First, connecting sections with the outside provided in the power conversion modules (20a to 20d and 40a to 40d) are configured to be only sections connected to the direct-current connection conductors P, C, and N, the alternating-current input conductors US and VS, or the alternating-current output conductors U, V, and W. That is, it is important that sections other than sections required to be connected from the power conversion modules to the outside are configured not to be exposed to the outside of the power conversion modules.

The power conversion device 100 is configured in this way because conductors only for connecting the power conversion modules to one another can be made unnecessary, the internal configuration of the power conversion device 100 can be simplified, and the number of components can be reduced to be extremely small. Consequently, effects of a reduction in the size and the weight and a reduction in the costs of the power conversion device 100 are obtained.

On the other hand, when the power conversion device 100 is not configured as explained above, a sufficient effect concerning the reduction in size and weight and the reduction in costs cannot be obtained. For example, in FIG. 2, a group of UPC1A, UPC1B, UPC2A, and UPC2B and a group of UD1A, UD1B, UD2A, and UD2B are divided and the respective groups are configured as separate power conversion modules. In this case, it is necessary to provide anew a connection conductor 22 shown as an internal conductor in FIG. 2 and connect the power conversion modules. The connection conductor 22 is used for only connection among the power conversion modules and does not need to be connected to the outside. An increase in the weight and an increase in the costs of the power conversion device 100 are caused by complication of a power conversion module structure and an increase in the number of components due to the addition of the connection conductor 22.

A next point to be considered is to equalize generation losses of the power conversion modules (20a to 20d and 40a to 40d). As explained below, this has an effect of simplifying the configurations of the coolers 28 configuring the power conversion modules (20a to 20d and 40a to 40d) and cooling means for cooling the power conversion modules.

It is preferable to equalize the generation losses between the conversion power conversion modules (20a to 20d) and the inverter power conversion modules (40a to 40d). However, generation losses among the converter power conversion modules (20a to 20d) or generation losses among the inverter power conversion modules (40a to 40d) can be equalized (e.g., a generation loss of 20a=a generation loss of 20b=a generation loss of 20c=a generation loss of 20d, or a generation loss of 40a=a generation loss of 40b=a generation loss of 40c=a generation loss of 40d).

For example, the converter circuit 20 is configured by the converter power conversion modules 20a to 20d. The viewpoint explained above can be attained by dividedly configuring the converter circuit 20 such that the converter power conversion module 20a configures the U-phase upper arm, the converter power conversion module 20b configures the U-phase lower arm, the conversion power conversion module 20c configures the V-phase upper arm, and the converter power conversion module 20d configures the V-phase lower arm.

It is possible to equalize the sizes of the coolers 28 used in the power conversion modules (20a to 20d and 40a to 40d) by equalizing the generation losses of the power conversion modules. Consequently, there is an advantage that the cooler 28 can be made as a common component for each of the power conversion modules (20a to 20d and 40a to 40d) and it is possible to reduce costs and manufacturing costs through a mass production effect.

As explained below, it is possible to arrange two coolers 28 back to back in one cooler attachment member 72.

Further, as explained below, it is possible to secure a degree of freedom of the arrangement of the power conversion modules (20a to 20d and 40a to 40d) according to a positional relation between the power conversion device 100 and the alternating-current motors (60a to 60d).

A point to be further considered is to equalize the number or a mounting area of the semiconductor elements 25 mounted on the power conversion modules. Consequently, it is possible to equalize the sizes of the coolers 28 of the power conversion modules (20a to 20d and 40a to 40d). As explained above, there is an advantage that a common component can be used as the coolers 28 used in the power conversion modules (20a to 20d and 40a to 40d) and it is possible to reduce costs and manufacturing costs through a mass production effect. As explained below, it is possible to secure a degree of freedom of the arrangement of the power conversion modules (20a to 20d and 40a to 40d) according to a positional relation between the power conversion device 100 and the alternating-current motors (60a to 60d).

In the configurations shown in FIG. 1, FIG. 2, and FIG. 3, in a general power conversion device for an electric motor vehicle, the converter circuit 20 and the inverter circuit 40 are divided to configure the converter power conversion modules 20a to 20d and the inverter power conversion modules 40a to 40d taking into account the main points explained above.

More specifically, when the converter circuit 20 is, for example, a single-phase three-level converter circuit and the arms are applied to a configuration in which semiconductor elements are connected in parallel in two rows, it is suitable to configure the converter circuit 20 to be divided into the converter power conversion module 20a for the U-phase upper arm mounted with six semiconductor elements configuring the U-phase upper arm, the converter power conversion module 20b for the U-phase lower arm mounted with six semiconductor elements configuring the U-phase lower arm, the converter power conversion module 20c for the V-phase upper arm mounted with six semiconductor elements configuring the V-phase upper arm, and the converter power conversion module 20d for the V-phase lower arm mounted with six semiconductor elements configuring the V-phase lower arm.

Similarly, the inverter circuit 40 is explained. When the inverter circuit 40 combined with the converter circuit 20 is a three-phase two-level inverter circuit and one set of bridge circuits configuring the inverter circuit 40 configures one inverter power conversion module, it is suitable to configure the inverter circuit 40 to be divided into the first inverter power conversion module 40a configuring a first inverter circuit, the second inverter power conversion module 40b configuring a second inverter circuit, the third inverter power conversion module 40c configuring a third inverter circuit, and the fourth inverter power conversion module 40d configuring a fourth inverter circuit.

Note that an assumed capacity of the power conversion device 100 is about 1 megawatt and a voltage between the direct-current connection conductors P and N is about 1.5 kilovolts to 3 kilovolts.

FIG. 6 is a diagram of an internal arrangement configuration example of the power conversion device in the embodiment of the present invention. FIG. 6(a) is a view (a top view) of the power conversion device 100 viewed from above. FIG. 6(b) is a view (a side view) of the power conversion device 100 viewed from a side surface (a side surface side of the electric motor vehicle).

The power conversion device 100 includes, as shown in FIG. 6, a first power conversion block 70a including first and second power conversion sub-blocks (75a and 75b: the internal configuration of which is explained below) and a first connection conductor plate 74a, a second power conversion block 70b including third and fourth power conversion sub-blocks (75c and 75d: the internal configuration of which is equivalent to 75a and 75b) and a second connection conductor plate 74b, the capacitor module 30, the capacitor conductor plate 80 including at least the direct-current connection conductors P and N connected to a capacitor terminal 31, which is a terminal of the capacitor module 30, a conductor connection member 81 that connects the first connection conductor plate 74a or the second connection conductor plate 74b and the capacitor conductor plate 80, first to fourth air guide members (66a to 66d) set in contact with first to fourth cooler attachment members (72a to 72d) via first seal members 106, cooling fans 65a and 65b for circulating cooling air to the first to fourth air guide members (66a to 66d), and an inspection cover 105.

The first to fourth power conversion sub-blocks (75a to 75d) are cooled by cooling air sent by the cooling fan 65a and 65b via the first to fourth air guide members (66a to 66d).

The first to fourth air guide members (66a to 66d) are configured to be in contact with the first to fourth cooler attachment members (72a to 72d) incorporated in the first and second power conversion blocks 70a and 70b via the first seal members 106.

Note that the first seal members 106 can be provided between the cooling fans 65a and 65b and the first to fourth air guide members (66a to 66d) so as to integrate the first to fourth air guide members (66a to 66d) with the first and second power conversion blocks (70a and 70b).

The arrangement of the conductor plates is explained with reference to the first power conversion block 70a as an example.

The first connection conductor plate 74a is arranged in parallel to the bottom surface of the device (the floor surface) on the lower side of the first cooler attachment member 72a and the second cooler attachment member 72b. The direction of cooling air in a cooling air exit section of the cooler and the length direction of the first connection conductor plate 74a are arranged to be orthogonal to each other. Further, one end portion of the first connection conductor plate 74a is configured to be connectable to the capacitor conductor plate 80 via the conductor connection member 81.

Note that the first connection conductor plate 74a can be arranged in parallel to the bottom surface of the device on the upper side of the first cooler attachment member 72a and the second cooler attachment member 72b as shown in FIG. 7. In this arrangement example, as in the arrangement explained above, the direction of the cooling air and the length direction of the first connection conductor plate are arranged to be orthogonal to each other. Therefore, in the arrangement example shown in FIG. 7, as in the arrangement explained above, one end of the first connection conductor plate 74a can be configured to be connectable to the capacitor conductor plate 80 via the conductor connection member 81.

The arrangement and the connection of the conductor plates in the first power conversion block 70a are explained above. The second power conversion block 70b can be configured the same.

By configuring the first power conversion block 70a as explained above, it is possible to build a main circuit wiring structure that connects a plurality of power conversion circuits at an extremely small distance while avoiding structural interference with a cooling system.

By detaching the inspection cover 105 on the device bottom surface, it is possible to attach and detach the conductor connection member 81. Further, by detaching the conductor connection member 81, it is possible to separate the first connection conductor plate 74a or the second connection conductor plate 74b and the capacitor conductor plate 80. By configuring the first power conversion block 70a in this way, it is made possible to adopt a structure in which the power conversion block is taken out to the side surface side of the vehicle. It is made possible to improve maintainability.

Figure 8:
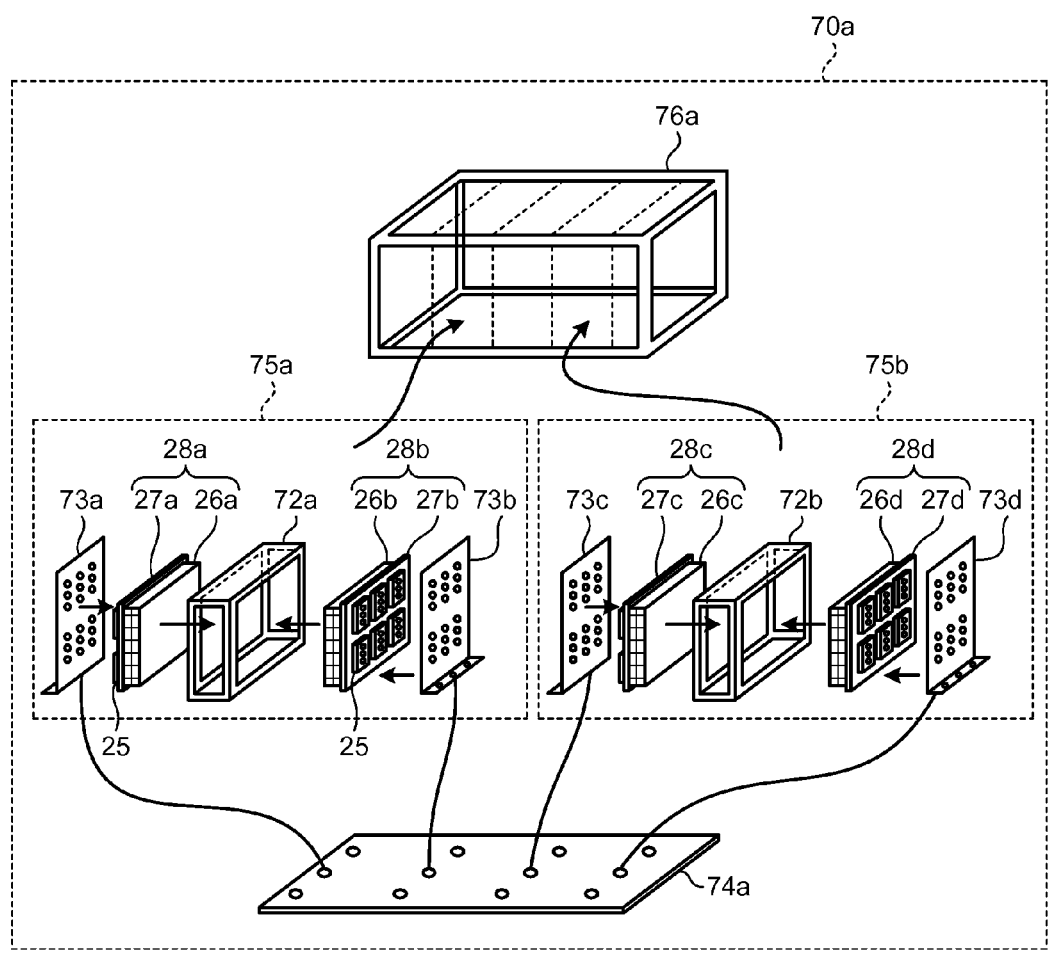
FIG. 8 is a diagram of a configuration example of a power conversion block in the embodiment of the present invention.

FIG. 8 is a diagram of a configuration example of the power conversion block in the embodiment of the present invention. The power conversion block 70a is configured by fixing the first power conversion sub-block 75a, the second power conversion sub-block 75b, and the first connection conductor plate 74a using a first unit joining frame 76a.

The first power conversion sub-block 75a includes a first cooler 28a including a first cooler fin section 26a and a first cooler base section 27a, a second cooler 28b including a second cooler fin section 26b and a second cooler base section 27b, a first cooler attachment member 72a to which the coolers are attached, a first conductor plate 73a connected to the semiconductor elements 25 mounted on the first cooler 28a, and a second conductor plate 73b connected to the semiconductor elements 25 mounted on the second cooler 28b.

The first conductor plate 73a includes at least the direct-current connection conductors P and N. The direct-current connection conductors P and N are stacked across an insulation layer and the first conductor plate 73a is configured.

Note that, when the first power conversion sub-block 75a includes the converter power conversion modules (20a to 20d), the first conductor plate 73a can be configured to further include the direct-current connection conductor C and the alternating-current input conductors US and VS. When the first power conversion sub-block 75a includes the inverter power conversion modules (40a to 40d), the first conductor plate 73a can be configured to include the alternating-current output conductors U, V, and W.

The first conductor plate 73a configured as explained above is arranged perpendicular to the first connection conductor plate 74a. A conductor of the first conductor plate 73a is connected to a conductor of the same type of the first connection conductor plate 74a. The same applies to the other second to fourth conductor plates (73b to 73d).

Note that the first to fourth conductor plates (73a to 73d), the first to fourth connection conductor plates (74a to 74d), and the capacitor conductor plate 80 (see FIG. 6) are assumed to be configured by stacking and arranging necessary numbers of conductor thin plates of copper or the like and sheet-like insulation materials.

Note that the configurations of the alternating-current input conductors US and VS and the alternating-current output conductors U, V, and W are explained below.

Referring back to the configuration shown in FIG. 8, both of the first cooler fin section 26a of the first cooler 28a and the second cooler fin section 26b of the second cooler 28b are arranged back to back on the inner side of the first cooler attachment member 72a and configured to be capable of being collectively cooled by the cooling air.

The inner side of the first cooler attachment member 72a on which the first cooler fin section 26a and the second cooler fin section 26b are arranged forms an opened section opened to the atmosphere in which cooling air including rain or snow flows. On the outer side of the first cooler attachment member 72a, the semiconductor elements 25, the conductor plates, and other electric components (not shown in the figure) are arranged. The outer side forms a closed section configured such that the air, water, and the like do not intrude from the opened section. Seal members (explained below) such as rubber gaskets or silicon seal materials are arranged in a boundary portion between the opened section and the closed section, that is, arranged between the first cooler 28a and the cooler attachment member 72a and between the second cooler 28b and the cooler attachment member 72a to form a structure for maintaining necessary airtightness.

Note that the length of the first cooler attachment member 72a in a direction in which the cooling air flows is a length necessary for attaching the first and second coolers (28a and 28b) and is substantially equal to the length of the first and second coolers (28a and 28b) in the same direction.

The first cooler 28a and the second cooler 28b arranged back to back on the first cooler attachment member 72 are preferably formed in the same size. By doing so, the first to fourth cooler attachment members (72a to 72d) can be formed of the same member.

As explained above, the first connection conductor plate 74a is configured to be connectable to the capacitor conductor plate 80 via the conductor connection member 81 as explained above (see FIG. 6). The first connection conductor plate 74a is a conductor plate obtained by stacking conductors including at least the connection conductors P and N.

Note that, as shown in FIG. 8, the second power conversion sub-block 75b is configured the same to include third and fourth coolers (28c and 28d) including third and fourth cooler fin sections (26c and 26d), a second cooler attachment members 72b, and third and fourth conductor plates (73c and 73d).

Figure 9:
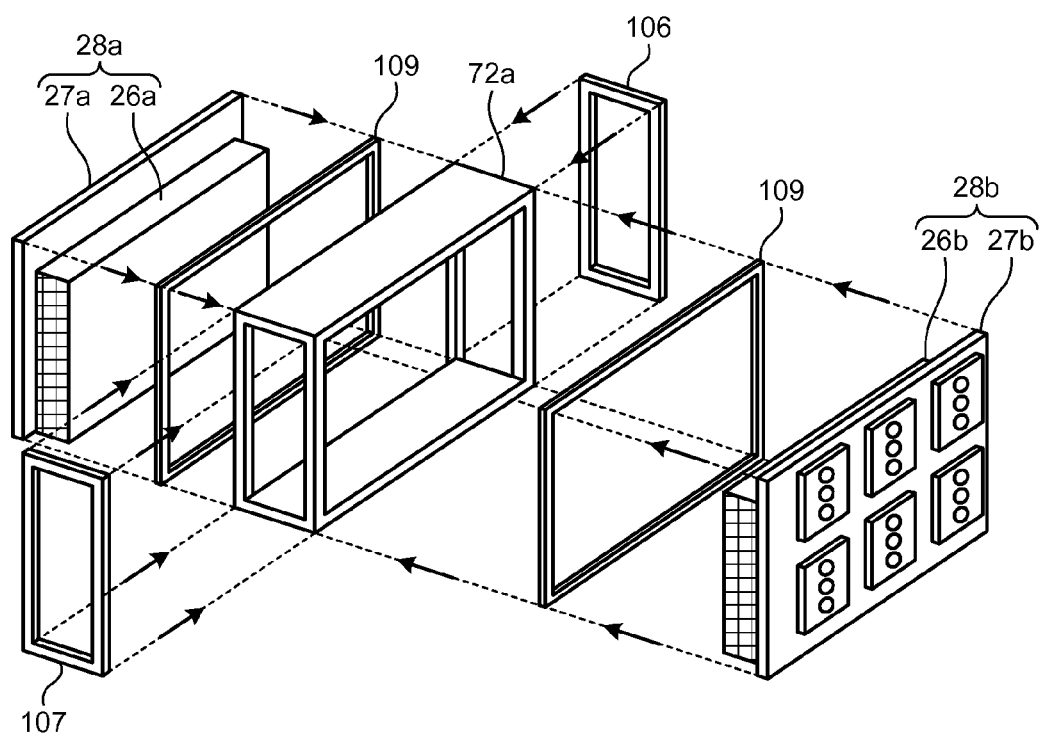
FIG. 9 is a diagram of a seal part of the power conversion block in the embodiment of the present invention.

FIG. 9 is a diagram of a seal part of the power conversion block in the embodiment of the present invention. Note that, in FIG. 9, the first power conversion sub-block 75a is shown as an example. However, the other power conversion blocks are configured the same.

In FIG. 9, first, the first seal member 106 and a second seal member 107 are arranged in parts equivalent to an inlet and an outlet for the cooling air of the first cooler attachment member 72a. This prevents dust and moisture from intruding into the closed section on the outside from the opened section on the inner side, which is an air path, while making it possible to detach the first power conversion block 70a from the power conversion device.

The first cooler attachment member 72a and the first cooler 28a are sealed and the first cooler attachment member 72a and the second cooler 28b are sealed by fourth seal members 109. This prevents dust and moisture from intruding into the closed section on the outside from the opened section on the inner side, which is an air path. When moisture or the like intrudes into the closed section, a main circuit wiring and the like arranged in the closed section are likely to cause a ground fault. Therefore, this seal is important in securing the quality of the power conversion device.

Note that, when the extension distance of the seal members shown in FIG. 9 is made as short as possible, it is possible to reduce costs required for work. Further, it is possible to reduce likelihood of a deficiency such as a water leak to the closed section due to a seal leak.

By adopting the configuration disclosed in this embodiment, it is possible to reduce the extension distance of the seal members compared with other configuration examples in which, for example, the coolers 28 are respectively attached to separate cooler attachment members.

In a state of a structure obtained by combining the first cooler 28a, the second cooler 28b, and the first cooler attachment member 72a (i.e., the state shown in FIG. 9), seal members (waterproof seals or the like) for a boundary portion thereof (the boundary portion between the opened section and the closed section) can be constructed. Therefore, all of seal constructed parts and finish states of the seal constructed parts can be visually checked, so that reliable sealing work can be performed. Further, construction of seal members in deep parts and bag-like less visible parts is unnecessary. Therefore, it is made possible to improve quality, work time is reduced, and it is possible to reduce costs.

Figure 10:
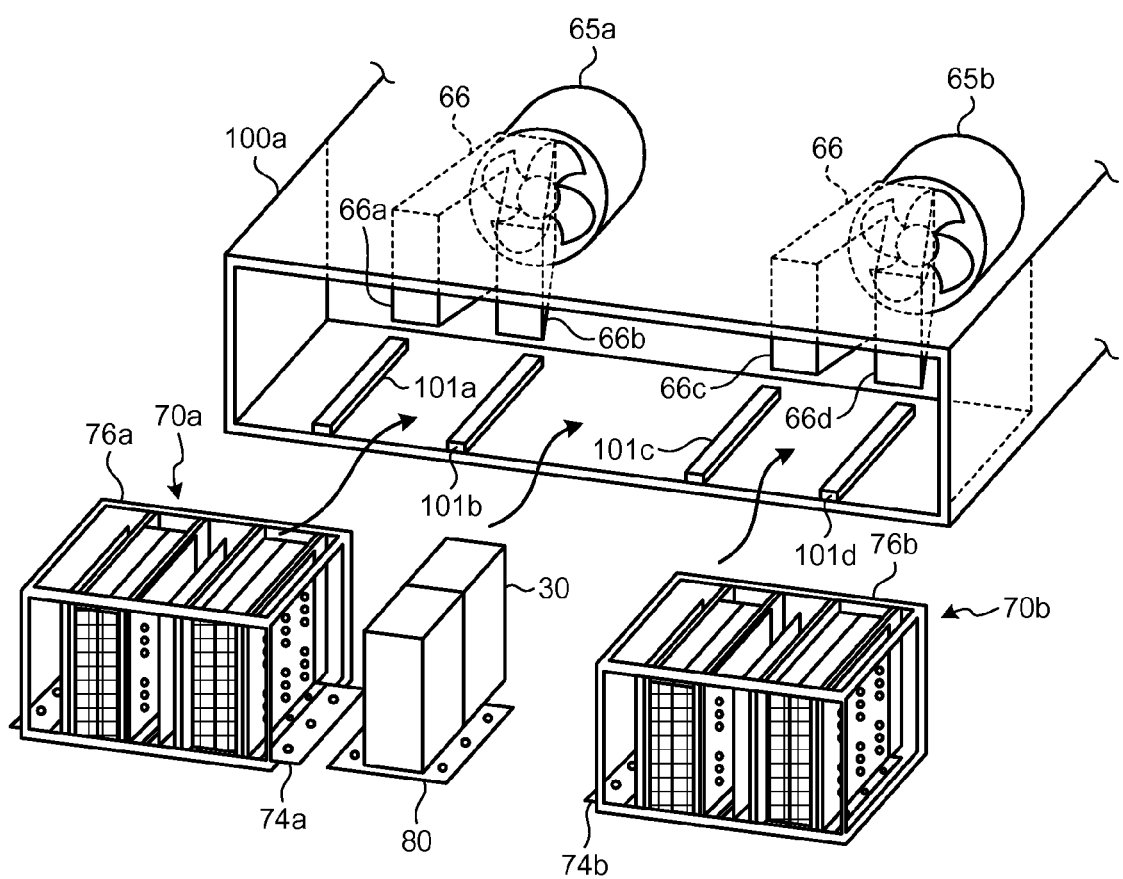
FIG. 10 is a diagram of a housing example in a power conversion device housing box of the power conversion block in the embodiment of the present invention.

FIG. 10 is a diagram of a housing example in a power conversion device housing box 100a of the power conversion block in this embodiment of the present invention. As shown in FIG. 10, each of the first power conversion block 70a and the second power conversion block 70b is housed in the power conversion device housing box 100a from the side surface of the power conversion device 100. Note that each of the first power conversion block 70a and the second power conversion block 70b has weight of several hundred kilograms. Therefore, slide rails 101a to 101d are provided on the bottom surface of the power conversion device housing box 100a. The first power conversion block 70a and the second power conversion block 70b are slid on the slide rails 101a to 101d to be housed in the power conversion device housing box 100a. Note that the capacitor module 30 is housed in the same manner (slide rails for the capacitor module 30 is not shown in the figure).

The first unit joining frame 76a and the power conversion device housing box 100a are fastened by bolts and the like, whereby the first power conversion block 70a is fixed in the power conversion device 100. A second unit joining frame 76b and the power conversion device housing box 100a are fastened by bolts and the like, whereby the second power conversion block 70b is fixed in the power conversion device 100.

The first to fourth air guide members (66a to 66d) are provided in the power conversion device housing box 100a. More specifically, when the first power conversion block 70a and the second power conversion block 70b are housed inside the power conversion device 100, one ends of the first to fourth air guide members (66a to 66d) are arranged to be set in contact with the first to fourth cooler attachment members (72a to 72d) shown in FIG. 9 via the first seal members 106.

Note that the first to fourth air guide members (66a to 66d) can be configured to be included in the first power conversion block 70a and the second power conversion block 70b. In the case of this configuration, the first to fourth air guide members (66a to 66d) are formed to be integrated with the first power conversion block 70a or the second power conversion block 70b and attached to and detached from the power conversion device 100. In this case, the air guide members 66 are configured to be set in contact with the cooling fan 65 via the first seal members 106.

With the configuration explained above, it is easy to house the power conversion block 70 in the power conversion device housing box 100a and detach the power conversion block 70 from the power conversion device housing box 100a. A separation structure of the opened section and the closed section is configured simultaneously with the housing.

Figure 11:
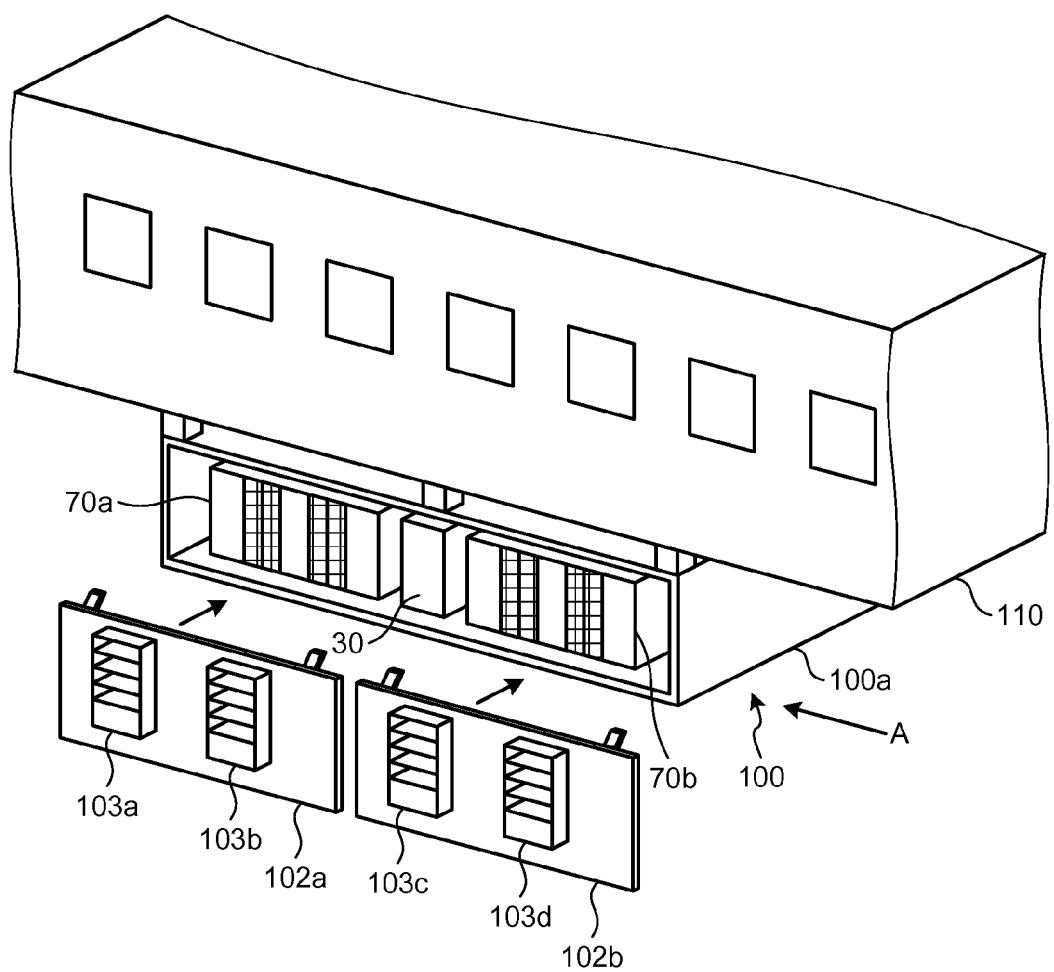
FIG. 11 is a diagram of a mounting example on a vehicle of the power conversion device in the embodiment of the present invention.

FIG. 11 is a diagram of a mounting example on a vehicle of the power conversion device in the embodiment of the present invention. More specifically, in FIG. 11, a state is shown in which the first power conversion block 70a, the second power conversion block 70b, and the capacitor module 30 are housed in the power conversion device 100, with the covers on the side surface being detached. As shown in the figure, the power conversion device housing box 100a is formed to be set under the floor of a vehicle body 110 of an electric motor vehicle. As the covers of the power conversion device 100, a first cover 102a and a second cover 102b are provided. The first cover 102a is formed in a structure in which ventilation ducts 103a and 103b are provided and ventilation between the inner side of the first and second cooler attachment members 72a and 72b (see FIG. 9) incorporated in the first power conversion block 70a and the outdoor air is possible. The first cover 102a is attached to the power conversion device housing box 100a. The same applies to the second cover 102b. The second cover 102b includes the ventilation ducts 103a and 103b and is attached to the power conversion device housing box 100a like the first cover 102a.

Figure 12:
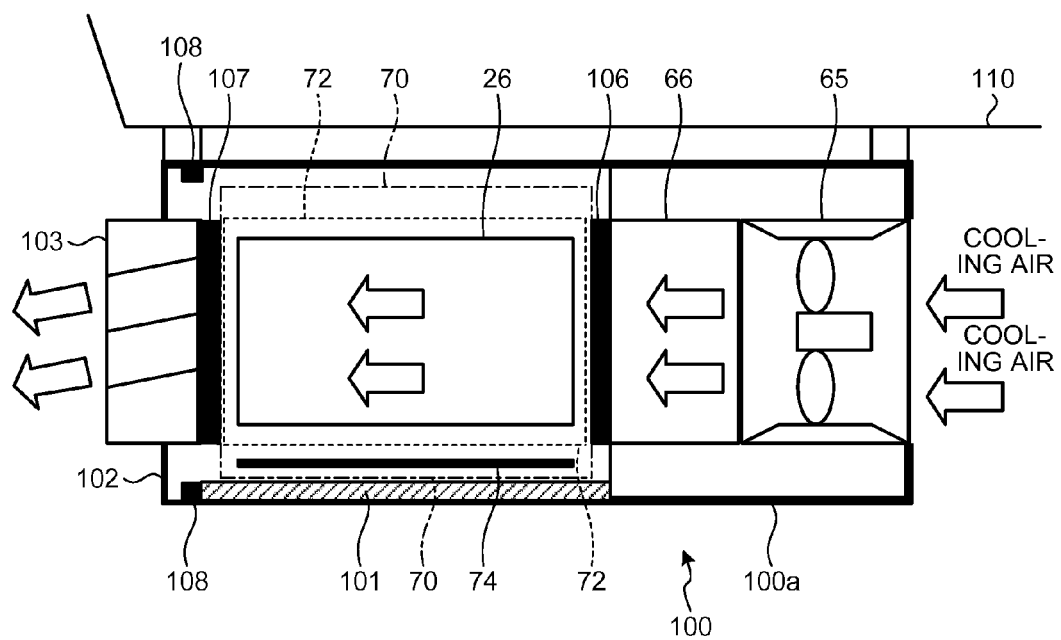
FIG. 12 is a diagram of a sectional configuration of the power conversion device in the embodiment of the present invention.

FIG. 12 is a diagram of a sectional configuration of the power conversion device in the embodiment of the present invention. More specifically, FIG. 12 shows a sectional configuration of the power conversion device 100 viewed from the direction of an arrow A shown in FIG. 11. In FIG. 12, cooling air flows through a path of the cooling fan 65, the air guide member 66, the cooler fin section 26 arranged on the inner side of the cooler attachment member 72, and the ventilation duct 103. The air path through which the cooling air flows is the opened section as explained above.

Both ends of the cooler attachment member 72 are configured to be respectively coupled to the air guide member 66 and the ventilation duct 103 via the first seal member 106 and the second seal member 107.

With this configuration, by detaching the cover 102, it is possible to access the power conversion block 70 from the outside. It is possible to easily draw out the power conversion block 70 to the outside from a box in the power conversion device 100.

Note that, in FIG. 12, a configuration is shown in which the seal member 106 is arranged on at least one of the cooler attachment member 72 side of the air guide member 66 and the air guide member 66 side of the cooler attachment member 72. However, the power conversion device 100 can be configured to provide a cooling fan attachment member between the air guide member 66 and the cooling fan 65 and a seal member is arranged on at least one of the air guide member 66 side of the cooling fan attachment member and the cooling fan 65 side of the cooling fan attachment member.

With this configuration, in a state in which the power conversion block 70 is housed in the power conversion device 100, it is possible to configure a structure that can automatically prevent intrusion of dust and water into the closed section from the opened section.

A third seal member 108 is provided in a section where the cover 102 comes into contact with the power conversion device housing box 100a. It is possible to prevent intrusion of dust and water into the closed section from the outside.

Because the power conversion device 100 is configured as explained above, for example, when the semiconductor element 25 fails, by detaching the conductor connection member 81 (see FIG. 6) after detaching the cover 102 (the first cover 102a or the second cover 102b), it is possible to draw out the power conversion block 70 (the first power conversion block 70a or the second power conversion block 70b) to the vehicle side surface side and detach the power conversion block 70. Therefore, recovery from the failure is easy.

The cooler attachment member 72 has substantially the same length as the cooler 28 (see FIG. 8, FIG. 9, etc.). Therefore, by detaching the first power conversion block 70a and the second power conversion block 70b from the power conversion device 100, both surfaces on an air entering side and an air discharging side of the cooler fin section 26 are exposed to the outside. Therefore, it is easy to clean dust and the like deposited on fins of the cooler fin section 26.

For the size of the power conversion device 100 configured as explained above, width (the lateral direction in the figure) is about 3000 millimeters, depth is about 1000 millimeters, height is about 700 millimeters, and weight is about 1500 kilograms. Therefore, it is possible to efficiently set the power conversion device 100 under the floor of the electric motor vehicle.

With the power conversion device in this embodiment configured as explained above, it is possible to obtain effects explained below.

The first connection conductor plate 74a is arranged in parallel to the bottom surface of the device on the lower side or the upper side of the first cooler attachment member 72a and the second cooler attachment member 72b. The direction of the cooling air and the length direction of the first connection conductor plate 74a are arranged to be orthogonal to each other. Further, one end portion of the first connection conductor plate 74a is configured to be connectable to the capacitor conductor plate 80 via the conductor connection member 81. With these configurations, it is possible to build a main circuit wiring structure that connects a plurality of power conversion circuits at a shortest distance while avoiding structural interference with a cooling system.

As the first power conversion block 70a, both of the first cooler fin section 26a of the first cooler 28a and the second cooler fin section 26b of the second cooler 28b are configured to be arranged back to back on the inner side of the first cooler attachment member 27a (the second to fourth power conversion blocks 70b to 70d are configured the same). With this configuration, compared with the conventional configuration, it is possible to reduce the distance to the boundary portion between the opened section and the closed section of the cooler attachment member. As a result, it is possible to reduce the length (an amount) of the seal members, i.e., the first seal member 106, the second seal member 107, and the fourth seal member 109 necessary in the boundary portion between the opened section and the closed section, and it is made possible to reduce costs, reduce an assembly workload, and improve quality.

In a state of the structure obtained by combining the first cooler 28a, the second cooler 28b, and the first cooler attachment member 72a, seal members (waterproof seals or the like) for a boundary portion thereof (the boundary portion of the opened section and the closed section) can be constructed. As a result, all of seal member constructed parts and finished states of the seal member constructed parts can be visually checked. Sure seal work can be performed. Further, construction of seal members in deep parts and bag-like less visible parts is unnecessary. Therefore, it is possible to improve quality, work time is reduced, and it is possible to reduce costs.

From the viewpoint of maintenance, by detaching the conductor connection member 81 after detaching the cover first and second covers (102a and 102b), it is possible to draw out the first and second power conversion blocks (70a and 70b) to the side surface side of the vehicle and detach the power conversion blocks. Therefore, recovery from the failure is easy.

By detaching the first and second power conversion blocks (70a and 70b) from the power conversion device 100, both the surfaces on the air entering side and the air discharging side of the cooler fin section 26 are exposed to the outside. Therefore, it is easy to clean dust and the like deposited on the fins of the fin section.

As explained above, with the power conversion device in this embodiment, it is possible to provide a forced air cooling-type power conversion device that can realize an optimum cooling structure, an optimum main circuit wiring structure, and improvement of maintainability and attain a reduction in the size, the weight, and the costs of the power conversion circuit.

Note that, in this embodiment, the power conversion device of the alternating-current input type that drives the permanent magnet synchronous motor is explained as an example. However, the present invention is not limited by this embodiment. For example, a system of a direct-current input type only has to be configured to input direct-current power, which is supplied from an overhead wire, to an inverter circuit. Therefore, a converter circuit is unnecessary.

An arrangement example of the converter power conversion modules 20a to 20d and the inverter power conversion modules 40a to 40d in the power conversion device 100 configured as explained above is explained.

FIG. 13 is a diagram of an example of device arrangement and power conversion module arrangement in the embodiment of the present invention. More specifically, FIG. 13(a) shows a device arrangement example in an electric motor vehicle. FIG. 13(b) shows an arrangement example of a power conversion module in which devices are arranged as shown in FIG. 13(a). Note that, as shown in the figure, the power conversion device 100 and the transformer 6 are mounted on the same vehicle. The power conversion device 100 is configured to drive the alternating-current motors 60a to 60d of a vehicle adjacent to the vehicle.

As shown in FIG. 13(b), the inverter power conversion modules 40a to 40d, the capacitor module 30, and the converter power conversion modules 20a to 20d are arranged in this order from the left in the figure.

In the inverter power conversion modules 40a to 40d, the alternating-current output conductors U, V, and W to the alternating-current motors 60a to 60d are electrically connected to the semiconductor elements 25 mounted on the inverter power conversion modules 40a to 40d. In this case, the conductor plate 73 and the connection conductor plate 74a are considered to be conductors including the alternating-current output conductors U, V, and W besides the direct-current connection conductors P and N.

In the converter power conversion modules 20a to 20d, the alternating-current input conductors US and VS to the transformer 6 are electrically connected to the semiconductor elements 25 mounted thereon. In this case, the conductor plate 73 and the connection conductor plate 74b are considered to be conductors including the alternating-current input conductors US and VS besides the direct-current connection conductors P and N.

FIG. 14 is a diagram of another example of the device arrangement and the power conversion module arrangement in the embodiment of the present invention. More specifically, FIG. 14(a) shows a device arrangement example in the electric motor vehicle. FIG. 14(b) shows an arrangement example of the power conversion module in which the devices are arranged as shown in FIG. 14(a). In a configuration shown in FIG. 14, unlike FIG. 13, the power conversion device 100 and the transformer 6 are mounted on different vehicles. The power conversion device 100 is configured to be arranged in an intermediate position between the alternating-current motors 60a and 60b and the alternating-current motors 60c and 60d.

As shown in FIG. 14(b), The inverter power conversion modules 40a and 40b, the converter power conversion modules 20a and 20b, the capacitor module 30, the converter power conversion modules 20c and 20d, and the inverter power conversion modules 40c and 40d are arranged in this order from the left in the figure.

In the inverter power conversion modules 40a and 40b, alternating-current output conductors U, V, and W to the alternating-current motors 60a and 60b are electrically connected to the semiconductor elements 25 mounted thereon. In the converter power conversion modules 20a and 20b, the alternating-current input conductor US to the transformer 6 is connected to the semiconductor elements 25 mounted thereon. In this case, the conductor plate 73 and the connection conductor plate 74a are considered to be conductors including the alternating-current output conductors U, V, and W and the alternating-current input conductor US besides the direct-current connection conductors P and N.

In the converter power conversion modules 20c and 20d, the alternating-current input conductor VS to the transformer 6 is connected to the semiconductor elements 25 mounted thereon. In the inverter power conversion modules 40c and 40d, the alternating-current output conductors U, V, and W to the alternating-current motors 60c and 60d are connected to the semiconductor elements 25 mounted thereon. In this case, the conductor plate 73 and the connection conductor plate 74b are considered to be conductors including the alternating-current input conductor VS and the alternating-current output conductors U, V, and W besides the direct-current connection conductors P and N. Further, the capacitor conductor plate 80 is considered to be a conductor including the alternating-current input conductor US besides the direct-current connection conductors P, C, and N.

As it is seen from the example explained above, the converter power conversion modules 20a to 20d and the inverter power conversion modules 40a to 40d can be arranged in any order and in any positions.

As explained above, in the configuration of the power conversion device in this embodiment, the power conversion sub-blocks 75 are arranged adjacent to one another in order in the length direction of the vehicle and can be connected by the connection conductor plates 74a and 74b. The direction of the cooling air (the direction in which the cooling air flows on the inside of the cooler attachment member 72) is orthogonal to the length direction of the connection conductor plates 74a and 74b. Consequently, by adding the conductors included in the conductor plate 73 and the connection conductor plate 74 according to necessity, it is possible to flexibly set arrangement positions of the power conversion modules (20a to 20d and 40a to 40d) according to a positional relation among the power conversion device 100, the alternating-current motor 60, and the transformer 6 in the vehicle of the electric motor vehicle. Maintainability is secured the same and is not deteriorated irrespective of how the power conversion modules are arranged.

A cooling configuration of the converter power conversion modules 20a to 20d and the inverter power conversion modules 40a to 40d configured as explained above is explained.

As explained above, the converter power conversion modules 20a to 20d are configured by dividing the converter circuit 20 such that generation losses thereof are substantially equal. The inverter power conversion modules 40a to 40d are also configured by dividing the same circuit such that generation losses thereof are substantially equal.

The explanation is continued with reference to FIG. 6 and FIG. 13. Ideally, if all the generation losses of the converter power conversion modules 20a to 20d and the inverter power conversion modules 40a to 40d can be equalized, the cooling configuration is simple. However, realistically, this is difficult. Taking into account such a case, in the following explanation, generation loss of the converter circuit 20 and that of the inverter circuit 40 are different.

The first power conversion block 70a is configured by the converter power conversion modules 20a to 20d. The second power conversion block 70b is configured by the inverter power conversion module 40a to 40d. The power conversion blocks are cooled by the cooling fans 65a and 65b. In this case, generation losses are different in the converter power conversion modules 20a to 20d and the inverter power conversion modules 40a to 40d. Therefore, it is necessary to select the cooling fans 65a and 65b having different performances respectively matching the generation losses.

Further, in this case, for example, a large cooling fan is appropriate for the power conversion modules having a larger generation loss and a small cooling fan is appropriate for the power conversion modules having a smaller generation loss. However, when the arrangement of the cooling fans 65a and 65b inside the power conversion device 100 is considered, the size of the power conversion device 100 is determined according to the large cooling fan, so that the space inside the power conversion device 100 cannot be effectively used. As a result, an increase in the size and an increase in the weight of the power conversion device 100 are caused. Further, because different cooling fans are used, two kinds of auxiliary cooling fans provided in preparation for a cooling fan failure are necessary. An increase in costs due to procurement of the different cooling fans is also caused.

On the other hand, as shown in FIG. 14, the first and second power conversion blocks 70a and 70b are configured by a set of two arbitrary converter power conversion modules and two arbitrary inverter power conversion modules. The power conversion blocks are respectively cooled by the cooling fans 65a and 65b. Consequently, total generation loss of the respective power conversion blocks becomes equal. Therefore, it is possible to use the same cooling fans 65a and 65b having ability enough for cooling an average loss of the converter power conversion modules and the inverter power conversion modules. Consequently, it is made possible to effectively use the space in the power conversion device 100. As a result, it is made possible to reduce the size and the weight of the power conversion device 100. Because the same cooling fans can be used, only one kind of cooling fans provided in preparation for a cooling fan failure are necessary. Further, because a larger number of same cooling fans can be ordered, it is possible to reduce procurement costs and reduce costs of the power conversion device 100.

As explained above, with the configuration in this embodiment, it is possible to stack a necessary number of the power conversion sub-blocks 75 in the rail direction in any order to configure the power conversion device. It is possible to perform flexible internal arrangement according to a positional relation among the transformer 6, the alternating-current motor 60, and the power conversion device 100, configuration conditions of the cooling fans 65, and the like.

In the embodiment, the content of the invention is explained above mainly with reference to, as an example, the form in which the converter circuit 20 is the voltage-type three-level converter and the inverter circuit 40 is the voltage-type two-level inverter and the converter circuit 20 and the inverter circuit 40 drive the four alternating-current motors. However, the present invention can be a configuration other than this configuration. For example, the converter circuit 20 can be a voltage-type two-level converter and the inverter circuit 40 can be a voltage-type three-level inverter. The number of the semiconductor elements 25 connected in parallel can be arbitrarily determined according to a necessary power conversion capacity. Further, the content of this embodiment can be easily expanded even if the number of the alternating-current motors 60 driven by one power conversion device is other than four.

In the above explanation, the power conversion device that receives an alternating-current voltage, converts the alternating-current voltage into a direct-current voltage via the converter circuit 20, and supplies the alternating-current voltage to the inverter circuit 40 is explained as an example. However, as it is generally well-known, the power conversion device can be configured to directly receive a direct-current voltage from a direct-current overhead wire and supply the direct-current voltage to the inverter circuit 40. In this case, mainly the transformer 6, the input switch 10, and the converter circuit 20 are unnecessary. The power conversion device only has to be configured to input direct-current power, which is received from the overhead wire, to the capacitor module 30 and the inverter circuit 40 via an LC filter (not shown in the figure). In this case, the content of this embodiment can also be applied.

Note that the configuration explained above in the embodiment is an example of the content of the present invention. It goes without saying that the configuration can be combined with other publicly-known technologies or can be configured to be changed to, for example, omit a part of the configuration without departing from the spirit of the present invention.

INDUSTRIAL APPLICABILITY

As explained above, even when a forced air cooling-type power conversion device of a system for individually driving a plurality of motors is configured, the present invention is useful as a forced air cooling-type power conversion device configured to be capable of suppressing an increase in the size, the weight, and the costs of a power conversion circuit.

REFERENCE SIGNS LIST

1 Overhead wire
2 Current collector
3 Wheel
4 Rail
6 Transformer
10 Input switch
20 Converter circuit
20a to 20d Converter power conversion modules
22 Connection conductor
25 Semiconductor elements
26 Cooler fin section
26a to 26d First to fourth cooler fin sections
27 Cooler base section
27a to 27d First to fourth cooler base sections
28 Cooler
28a, 28b First and second coolers
30 Capacitor module
30P, 30N Capacitors
31 Capacitor terminal
40 Inverter circuit
40a to 40d Inverter power conversion modules
50a to 50d Motor opening switches
60, 60a to 60d Alternating-current motors
65 Cooling fan
65a, 65b First and second cooling fans
66 Air guide member
66a to 66d First to fourth air guide members
70 Power conversion block
70a to 70d First to fourth power conversion blocks
72 Cooler attachment member
72a to 72d First to fourth cooler attachment members
73 Conductor plate
73a, 73b First and second conductor plates
74 Connection conductor plate
74a, 74b First and second connection conductor plates
75 Power conversion sub-block
75a to 75d First to fourth power conversion sub-blocks
76a, 76b First and second unit joining frames
80 Capacitor conductor plate
81 Conductor connection member
100 Power conversion device
100a Power conversion device housing box
101a to 101d Slide rails
102 Cover
102a, 102b First and second covers
103 Ventilation duct
103a to 103d First to fourth ventilation ducts
105 Inspection cover
106 to 109 First to fourth seal members
110 Vehicle body
P, C, N Direct-current connection conductors
U, V, W Alternating-current output conductors
US, VS Alternating-current input conductors

The invention claimed is:

1. A forced air cooling-type power conversion device including power conversion circuits equipped with a plurality of semiconductor elements and a capacitor that stores direct-current power supply, the forced air cooling-type power conversion device converting electric power input from a power supply into an arbitrary value and outputting the electric power to a motor, the forced air cooling-type power conversion device comprising:
   power conversion modules each including:
      a part of the semiconductor elements configuring the power conversion circuits;
      a cooler base section on which the semiconductor elements are mounted; and
      a cooler fin section provided on a rear side of a surface in the cooler base section on which the semiconductor elements are mounted; and
   power conversion sub-blocks each including:
      a cooler attachment member to which the cooler fin sections in at least a pair of the power conversion modules are attached to face each other; and
      conductor plates connected to the semiconductor elements, wherein
      a plurality of the power conversion sub-blocks configure a power conversion block with a plurality of the conductor plates arranged perpendicularly to a connection conductor plate arranged in parallel to the bottom surface of the forced air cooling-type power conversion device,
   a plurality of the cooler fin sections arranged on an inner side of the cooler attachment member are collectively cooled by cooling air, and
   the power conversion block is connected to the capacitor and another power conversion block by the connection conductor plate.

2. The forced air cooling-type power conversion device according to claim 1, comprising:
   a cooling fan; and
   an air guide member that couples the cooling fan and the cooler attachment member,
   the forced air cooling-type power conversion device being configured to circulate, with the air guide member, the cooling air to the opened section of the cooler attachment member, wherein
   a seal member is arranged on at least one of the cooler attachment member side of the air guide member and the air guide member side of the cooler attachment member, and at least the power conversion module is configured to be capable of being drawn out to outside of the device so as to be attached and detached.

3. The forced air cooling-type power conversion device according to claim 1, comprising:
   a cooling fan; and
   an air guide member that couples the cooling fan and the cooler attachment member,
   the forced air cooling-type power conversion device being configured to blow, with the air guide member, the cooling air to the opened section of the cooler attachment member, wherein
   a seal member is arranged on at least one of the cooling fan side of the air guide member and the air guide member side of the cooler fan, and at least the power conversion modules are configured to be capable of being drawn out to outside of the device so as to be attached and detached.

4. The forced air cooling-type power conversion device according to claim 1, wherein
   the connection conductor plate is arranged in the closed section on an upper side or a lower side of the power conversion block and arranged in a direction in which a length direction thereof is orthogonal to a direction of the cooling air.

5. A forced air cooling-type power conversion device including a plurality of semiconductor elements, the forced air cooling-type power conversion device converting electric power input from a power supply into an arbitrary value and outputting the electric power to a motor, the forced air cooling-type power conversion device comprising:
   power conversion modules each including:
      the semiconductor elements;
      a cooler base section on which the semiconductor elements are mounted; and
      a cooler fin section provided on a rear side of a surface in the cooler base section on which the semiconductor elements are mounted;
   power conversion sub-blocks each including at least a pair of the power conversion modules;
   a power conversion block obtained by connecting a plurality of the power conversion sub-blocks using a connection conductor plate;
   slide rails provided in the power conversion device, the slide rails supporting the power conversion block;
   a capacitor that stores direct-current power; and
   a capacitor conductor plate connected to the capacitor, wherein
   the capacitor conductor plate and the connection conductor plate of the power conversion block are configured to be capable of being connected to and disconnected from each other by a conductor connection member,
   conductor plates connected to the plurality of semiconductor elements are arranged perpendicularly to the connection conductor plate arranged in parallel to a bottom surface of the power conversion device, and one end portion of the connection conductor plate of the power conversion block is configured to be connectable to a connection conductor plate of another power conversion block via the capacitor, and
   the power conversion block is configured to be capable of being drawn out to an outside of the device and attached and detached.

6. The forced air cooling-type power conversion device according to claim 5, wherein the connection conductor plate and the capacitor conductor plate are arranged horizontally along a device floor surface and include an opened section and a cover on a device lower surface to enable the conductor connection member to be attached and detached.

* * * * *